(12) United States Patent
Grant

(10) Patent No.: US 9,111,628 B1
(45) Date of Patent: Aug. 18, 2015

(54) READ MARGIN MEASUREMENT IN A READ-ONLY MEMORY

(71) Applicant: Texas Instruments Incorporated, Dallas, TX (US)

(72) Inventor: David Alexander Grant, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/722,385

(22) Filed: May 27, 2015

Related U.S. Application Data

(62) Division of application No. 14/082,660, filed on Nov. 18, 2013, now Pat. No. 9,076,557.

(60) Provisional application No. 61/727,995, filed on Nov. 19, 2012.

(51) Int. Cl.
| | |
|---|---|
| *G11C 7/00* | (2006.01) |
| *G11C 16/26* | (2006.01) |
| *G11C 16/04* | (2006.01) |
| *G11C 16/34* | (2006.01) |
| *G11C 29/50* | (2006.01) |
| *G11C 13/00* | (2006.01) |

(52) U.S. Cl.
CPC ............ *G11C 16/26* (2013.01); *G11C 16/0433* (2013.01); *G11C 16/0483* (2013.01); *G11C 16/3459* (2013.01); *G11C 29/50* (2013.01); *G11C 13/0064* (2013.01)

(58) Field of Classification Search
CPC .............. G11C 16/0483; G11C 16/26; G11C 16/3459; G11C 29/50; G11C 13/0064
USPC ......... 365/189.15, 201, 206, 185.25
See application file for complete search history.

(56) References Cited

U.S. PATENT DOCUMENTS

| | | | | |
|---|---|---|---|---|
| 5,511,026 | A * | 4/1996 | Cleveland et al. | 365/189.09 |
| 5,815,450 | A * | 9/1998 | Kimura | 365/203 |
| 5,859,798 | A * | 1/1999 | Yero | 365/185.25 |
| 5,946,241 | A * | 8/1999 | Zink et al. | 365/189.15 |
| 5,986,937 | A * | 11/1999 | Yero | 365/185.21 |
| 6,510,082 | B1 * | 1/2003 | Le et al. | 365/185.16 |
| 7,450,419 | B2 * | 11/2008 | Sakashita et al. | 365/185.08 |
| 8,228,749 | B2 * | 7/2012 | Deng et al. | 365/201 |
| 2014/0140141 | A1 * | 5/2014 | Grant | 365/185.25 |
| 2014/0241066 | A1 * | 8/2014 | Grant et al. | 365/185.18 |
| 2014/0347928 | A1 * | 11/2014 | Lee | 365/185.11 |

* cited by examiner

*Primary Examiner* — Viet Q Nguyen
(74) *Attorney, Agent, or Firm* — Rose Alyssa Keagy; Frank D. Cimino

(57) ABSTRACT

Read margin measurement circuitry for measuring the read margin of floating-gate programmable non-volatile memory cells. In some embodiments, the read margin of a cell with a floating-gate transistor in a non-conductive state is measured by periodically clocking a counter following initiation of a read cycle; a latch stores the counter contents upon the cell under test making a transition due to leakage of the floating-gate transistor. Logic for testing a group of cells in parallel is disclosed. In some embodiments, the read margin of a cell in which the floating-gate transistor is set to a conductive state is measured by repeatedly reading the cell, with the output developing a voltage corresponding to the duty cycle of the output of the read circuit.

5 Claims, 5 Drawing Sheets

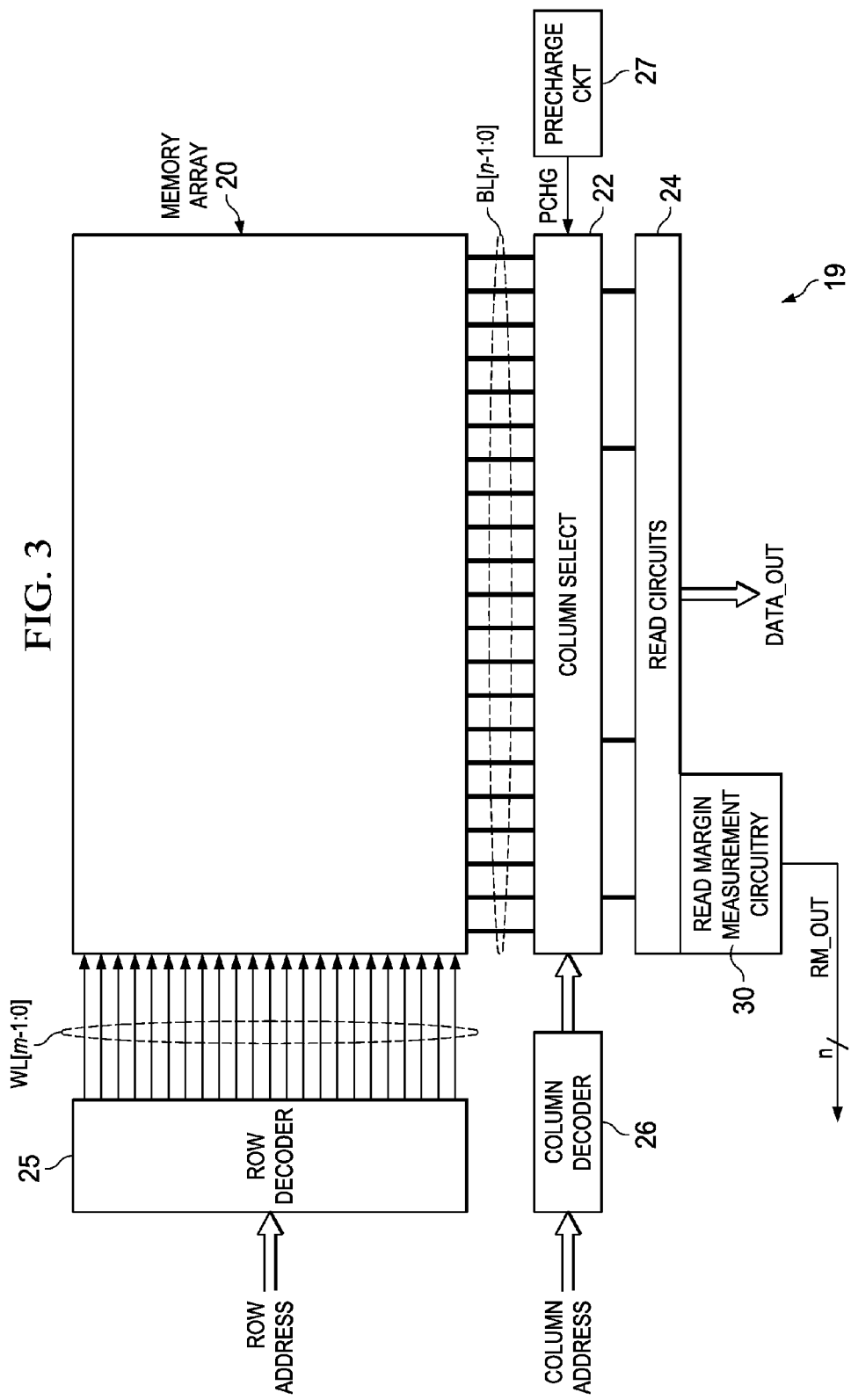

READ MARGIN MEASUREMENT IN A READ-ONLY MEMORY

CROSS-REFERENCE TO RELATED APPLICATIONS

This application is a divisional application of U.S. patent application Ser. No. 14/082,660 filed Nov. 18, 2013 which claims priority, under 35 U.S.C. §119(e), of Provisional Application No. 61/727,995, filed Nov. 19, 2012, and incorporated herein by this reference.

STATEMENT REGARDING FEDERALLY SPONSORED RESEARCH OR DEVELOPMENT

Not applicable.

BACKGROUND OF THE INVENTION

This invention is in the field of memory testing. Embodiments of this invention more specifically pertain to the measurement of read margin of read-only memory cells.

Non-volatile solid-state read/write memory devices are commonplace in many modern electronic systems, particularly in portable electronic devices and systems. Conventional types of non-volatile solid-state memory devices include those referred to as electrically programmable read-only memory (EPROM) devices. Modern EPROM or memory cells include one or more "floating-gate" transistors that store the data state. In a general sense, these floating-gate transistors are "programmed" by the application of a bias that enables holes or electrons to tunnel or be injected through a thin dielectric film onto an electrically isolated transistor gate element, which is the floating gate of the transistor. This trapped charge on the floating gate will modulate the apparent threshold voltage of the memory cell transistor, as compared with the threshold voltage with no charge trapped on the floating gate. This difference in threshold voltage can be detected by sensing the resulting difference in source-drain conduction, under normal transistor bias conditions, between the programmed and unprogrammed states. Some EPROM devices are "erasable" in that the trapped charge can be removed from the floating gate, for example by exposure of the memory cells to ultraviolet light (such memories referred to as "UV EPROMS") or by application of a particular electrical bias condition that enables tunneling of the charge from the floating gate (such memories referred to as electrically-erasable or electrically-alterable, i.e., EEPROMs and EAPROMS, respectively). "Flash" memory devices are typically realized by EEPROM memory arrays in which the erase operation is applied simultaneously to a "block" of memory cells.

Because of the convenience and efficiency of modern EPROM and EEPROM functions, it is now commonplace to embed non-volatile memory arrays within larger scale integrated circuits, such as modern complex microprocessors, digital signal processors, and other large-scale logic circuitry. Such embedded non-volatile memories can be used as non-volatile program memory storing software routines executable by the processor, and also as non-volatile data storage. On a smaller scale, non-volatile memory cells can realize control registers by way of which a larger scale logic circuit can be configured, or can be used to "trim" analog levels after electrical measurement.

As known in the art, "one-time programmable" ("OTP") memories are also popular, especially in embedded non-volatile memory applications as mentioned above. The memory cells of OTP memories are constructed similarly or identically as UV EPROM cells, and as such are not electrically erasable. But when mounted in an opaque package, without a window through which the memory can be exposed to ultraviolet light, the UV EPROM cells may be programmed one and only one time. In embedded applications, OTP memories are useful for storing the program code to be executed by the embedding microcontroller or microprocessor.

FIG. 1a illustrates the construction of conventional non-volatile memory cell $5_{j,k}$, which resides in a row j and column k of an EPROM array. In this example, cell $5_{j,k}$ includes p-channel metal-oxide semiconductor (MOS) select transistor 2, p-channel MOS floating-gate transistor 4, and n-channel MOS precharge transistor 6, with their source-drain paths connected in series between a high bias voltage Vhi and a low bias voltage Vlo (which may be at ground, for example). The gate of transistor 2 receives word line $WL_j^*$ for the row j in which cell $5_{j,k}$ resides (and which is a negative logic signal, as indicated by the *), and the gate of transistor 6 receives precharge signal PCHG. The gate of floating-gate transistor 4 is left floating in this example. Sense node SN is at the common drain node of transistors 4 and 6, and is connected to read circuit 8. In this example, read circuit 8 includes a buffer and Schmitt trigger in series, but may alternatively be arranged in any one of a number of known configurations.

Floating-gate transistor 4 is programmable by the application of a particular bias condition to its source and drain to cause electrons or holes to tunnel or be injected from the source or drain of transistor 4 into its floating gate electrode, and become trapped there. In some instances, the gate of select transistor 2 physically overlies, at least in part, the gate of floating-gate transistor 4 (e.g., in a "split-gate" arrangement), such that its voltage also plays a role in the programming mechanism. In UV EPROMs (and OTPs), the trapped charge will remain at the floating gate electrode indefinitely subject to leakage, or until photoelectrically recombined. In electrically erasable memories, an erase electrode (not shown in FIG. 1a) to provide the necessary bias for reverse tunneling of the trapped charge. That trapped charge modulates the threshold voltage of transistor 4, typically in a binary sense so that transistor 4 either conducts or does not conduct upon select transistor 2 being turned on. In the particular example of FIG. 1a, p-channel floating gate transistor 4 is considered programmed to a "1" data state if electrons are trapped on its floating gate electrode as a result of the programming operation. In this "1" programmed state, transistor 4 will conduct if it conducts with the application of a negative drain-to-source voltage. Conversely, the "0" data state corresponds to electrons not being trapped on the floating gate electrode of transistor 4, such that transistor 4 does not conduct with the application of a negative drain-to-source voltage.

In operation, the read cycle for cell $5_{j,k}$ begins with precharge signal PCHG being driven active high, which turns on precharge transistor 6; select transistor 2 is held off during this precharge operation, by word line $WL_j^*$ being inactive at a logic high level. This operation discharges sense node SN to voltage Vlo, following which precharge signal PCHG is driven inactive low to isolate sense node SN from voltage Vlo. The read of the state of floating-gate transistor 4 is then accomplished by word line $WL_j^*$ being driven active to a logic low level, for example in response to a memory address selecting row j in which cell $5_{j,k}$ resides. Select transistor 2 is turned on by word line $WL_j^*$ driven low, placing a high voltage Vhi (less any voltage drop across transistor 2) at the source of floating-gate transistor 4. If floating-gate transistor 4 has been programmed to its "1" state (i.e., electrons are trapped at its floating gate electrode, reducing the threshold voltage of the device), the negative drain-to-source voltage across transistor 4 will result in source/drain conduction, pulling the voltage at sense node SN high toward voltage Vhi. Conversely, if floating-gate transistor 4 is left in its unprogrammed "0" state (i.e., electrons are not trapped at its floating gate electrode), it will remain nominally non-conductive under the negative drain-to-source voltage, and sense node SN will remain at its discharged low level. In either case, the state of sense node SN will be communicated via read circuit 8 to terminal D_OUT, and communicated externally from the memory in the conventional manner.

FIG. 1b illustrates the response of voltage $V_{SN}$ at sense node SN following time $t_{WL}$ at which word line $WL_j*$ is driven low in the example of FIG. 1a. For the case in which floating-gate transistor 4 is programmed to a "1" state, sense node SN is rapidly pulled high upon select transistor 2 turning on as shown by trace RD(1). For example, the time at which voltage $V_{SN}$ crosses the trip level $V_{trip}$ of read circuit 8 may be on the order of 10 nsec in modern OTP memories. Conversely, for floating-gate transistor 4 in its unprogrammed "0" state, sense node SN remains nominally low, and is pulled high only by sub-threshold source/drain leakage, as shown by trace RD(0).

It has been observed, however, that the leakage characteristics of floating-gate transistors 4 over a population of memory cells 5 will vary from cell to cell (and of course from die to die). Depending on a wide range of manufacturing factors and defects, the sub-threshold leakage of some transistors 4 can be significant. In addition, as well known in the art, floating-gate transistors 4 commonly "age" in such a manner that source/drain leakage in the unprogrammed state increases over the operating life of the device. An example of the behavior of a weak instance of cell $5_{j,k}$ in its unprogrammed state is illustrated in FIG. 1b by trace $RD(0)_{wk}$. As evident from that trace, voltage $V_{SN}$ slowly goes high following the energizing of word line $WL_j*$ at time $t_{WL}$, due to leakage through transistor 4 in its off state. Voltage $V_{SN}$ for such a leaky device will eventually reach trip voltage $V_{trip}$, causing a false read (i.e., "1" is output by read circuit 8 instead of the correct "0" level). However, the time required for this false data state to be output can be quite long, for example on the order of microseconds (as opposed to the sub-10 nsec timing for a true "1" state). For typical read cycle times, this weak cell 5 may not currently exhibit a read error, but over time, the effects of aging may cause the read error to manifest in later life. In addition, such weaker cells are more vulnerable to read errors caused by noise in the read cycle.

It is useful for the manufacturer or end user to identify those memories and cells that are weak in this manner, especially considering that these cells will further weaken as they age. However, conventional time-zero electrical testing is not readily able to identify those weakened cells, or to quantify the extent of their weakness. For example, as shown in FIG. 1b, sensing of cell $5_{j,k}$ at a reasonable read time $t_{RD}$ will return the correct "0" state for both the strong "0" case as shown by trace RD(0) and also the weak "0" case as shown by trace $RD(0)_{wk}$. But the strong and weak cells can be distinguished by the sense node voltage $V_{SN}$ at read time $t_{RD}$. In this example, the difference between difference between sense node voltage $V_{SN}$ and trip voltage $V_{trip}$ at a read time $t_{RD}$ is referred to as the "read margin". In the example of FIG. 1b, a weak cell $5_{j,k}$ exhibits read margin RM0_wk, while a strong cell $5_{j,k}$ exhibits a much larger read margin RM0_str.

Measurement of these read margins would thus give an indication of the distribution of strong and weak cells in the memory array, and would also allow identification of the weaker cells that may limit the reliability and noise tolerance of the memory (enabling replacement of those cells by way of redundancy, for example). While the testing of read margin by way of proxies (e.g., variations in power supply voltages) can lend some indication of read margin, such tests are necessarily indirect and thus prone to both false positives (cells that do not appear weak but in fact are weak) and false negatives (cells that appear weak but in fact are not). Analog measurements of the read margin, for example by directly measuring the analog voltage at sense node SN, but require the costly addition of analog circuitry in the memory architecture.

While the above discussion pertains to the "read margin 0" for cells in their unprogrammed "0" state, cells in their programmed "1" state also exhibit a read margin ("read margin 1"). FIG. 1b illustrates the read margin 1 for cell $5_{j,k}$ in its "1" state as read margin RM1. Among the population of cells in their "1" state, some will exhibit weaker read margins than others, and are similarly prone to degradation over operating life and eventually failure.

BRIEF SUMMARY OF THE INVENTION

Embodiments of this invention provide circuitry and a method of operating the same for digitally measuring read margin of cells in a non-volatile programmable memory.

Embodiments of this invention provide such circuitry and corresponding method in which an actual read margin value, rather than simply a pass/fail result, is obtained.

Embodiments of this invention provide such circuitry and corresponding method that directly measures the read margin, without requiring the implementation of analog circuitry and component matching.

Embodiments of this invention provide such circuitry in a cost-efficient and area-efficient manner.

Embodiments of this invention provide such circuitry and corresponding method that readily tests multiple memory cells in parallel, thus reducing test time and test cost.

Embodiments of this invention provide such circuitry and corresponding method suitable for evaluating individual memory cells as may be useful in failure analysis.

Embodiments of this invention provide such circuitry and corresponding method that is suitable for measuring read margin for both digital data states.

Other objects and advantages of embodiments of this invention will be apparent to those of ordinary skill in the art having reference to the following specification together with its drawings.

Embodiments of this invention may be implemented into the read data path of a non-volatile memory in which the memory cells include a programmable floating-gate transistor in series with a precharge transistor. Read circuitry is coupled to a node between the precharge transistor and the floating-gate transistor in associated cells. A clocked counter counts a number of clock cycles and provides its contents to a latch that is triggered by a transition at the output of memory read circuitry. The latched counter value corresponds to the time at which one or more associated floating-gate memory cells that are programmed to a non-conductive state make a transition, and thus provides a measure of the read margin for the associated cells programmed to that non-conductive state.

Another aspect of the invention may be implemented in some embodiments in which multiple memory cells are read in parallel. Mask logic masks the outputs of one or more of parallel outputs so that the latch is triggered by selected ones of the parallel cells.

Another aspect of the invention may be implemented in some embodiments that measure the read margin for cells programmed to a conductive state, such that the output transition is expected to occur within a single clock cycle. An analog circuit, such as a resistor-capacitor network, is coupled to the output of the read circuitry, and the cell of interest is repeatedly read. An analog voltage is read after a number of cycles, that analog voltage corresponding to the duty cycle at the output of the read circuitry, and thus corresponding to the average fraction of the read clock cycle following the transition to the expected output from the cell of interest.

Other advantages and benefits of embodiments of this invention will be apparent to those skilled in the art having reference to this specification.

BRIEF DESCRIPTION OF THE SEVERAL VIEWS OF THE DRAWING

FIG. 3 is an electrical diagram, in block form, of a non-volatile memory in the integrated circuit of FIG. 2, constructed according to embodiments of the invention.

DETAILED DESCRIPTION OF THE INVENTION

This invention will be described in connection with one or more of its embodiments, namely as implemented into electrically-programmable read-only memory (EPROM) constructed according to a metal-oxide-semiconductor (MOS) technology, as it is contemplated that this invention is especially beneficial when implemented in that context. More specifically, embodiments of this invention will be described with reference to EPROM cells that are erasable by exposure to ultraviolet light (i.e., UV EPROMs) or that are not erasable at all (one-time-programmable ROMs, or "OTP" ROMs). However, it is also contemplated that this invention can provide benefit in other circuit and structure applications, including in electrically erasable non-volatile memories. Accordingly, it is to be understood that the following description is provided by way of example only, and is not intended to limit the true scope of this invention as claimed.

Figure 2:
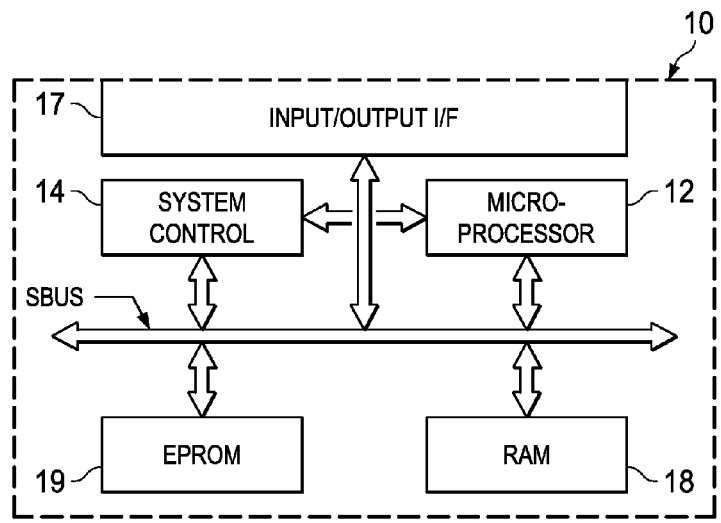
FIG. 2 is an electrical diagram, in block form, of a large scale integrated circuit constructed according to embodiments of the invention.

FIG. 2 illustrates an example of large-scale integrated circuit 10, in the form of a so-called "system-on-a-chip" ("SoC"), as now popular in many electronic systems. Integrated circuit 10 is a single-chip integrated circuit into which an entire computer architecture is realized. As such, in this example, integrated circuit 10 includes a central processing unit of microprocessor 12, which is connected to system bus SBUS. Various memory resources, including random access memory (RAM) 18 and electrically-programmable read-only memory (EPROM) 19, reside on system bus SBUS and are thus accessible to microprocessor 12.

In this example, EPROM 19 is of a type that may be erasable by exposure to ultraviolet light. As known in the art for UV EPROMs, whether the programmed state of EPROM 19 may in fact be erased will depend on the ultimate environment of integrated circuit 10. If packaged with a window that allows UV light exposure on the surface of integrated circuit 10, then EPROM 19 is erasable. Conversely, if integrated circuit 10 is packaged without such a window, then EPROM 19 will be in the form of a one-time programmable read-only memory. Alternatively, as will be mentioned below, EPROM 19 may be realized as an electrically-erasable programmable read-only memory (EEPROM). In any case, EPROM 19 typically serves as program memory, storing the program instructions executable by microprocessor 12, while RAM 18 serves as data memory. In some cases, program instructions may reside in RAM 18 for recall and execution by microprocessor 12. Other system functions are shown, in a generic sense, in integrated circuit 10 by way of system control 14 and input/output interface 17.

Those skilled in the art having reference to this specification will recognize that integrated circuit 10 may include additional or alternative functions to those shown in FIG. 2, or may have its functions arranged according to a different architecture from that shown in FIG. 2. The architecture and functionality of integrated circuit 10 is thus provided only by way of example, and is not intended to limit the scope of this invention.

FIG. 3 illustrates an example of the architecture of EPROM 19 according to embodiments of this invention. While FIG. 2 illustrates EPROM 19 as embedded memory within larger-scale integrated circuit 10, EPROM 19 may alternatively correspond to a stand-alone memory integrated circuit. Those skilled in the art having reference to this specification will also comprehend that the memory architecture of EPROM 19 in FIG. 3 is provided by way of example only, and that the memory architecture implementing embodiments of the invention may vary significantly from that shown in FIG. 3.

In this example, EPROM 19 includes memory array 20 containing programmable read-only memory cells arranged in rows and columns. While a single instance of memory array 20 is shown in FIG. 3, it is to be understood that EPROM 19 may include multiple memory arrays 20, each corresponding to a memory block within the address space of EPROM 19. In the example shown in FIG. 3, memory array 40 includes m rows and n columns of EPROM cells, each of which stores one data bit. In embodiments of this invention, EPROM cells in the same column share a single bit line BL[n−1:0], and EPROM cells in the same row share one of word lines WL[m−1:0]. Memory array 20 may be alternatively arranged to include multiple array blocks or sub-arrays of EPROM cells, depending on the addressing space or memory architecture. Row decoder 25 receives a row address value indicating the row of memory array 20 to be accessed, and energizes the one of word lines WL[m−1:0] corresponding to that row address value, which couples the EPROM cells in the corresponding row to the corresponding bit line BL[n−1:0] for the associated columns, to present a voltage or current dependent on the data state stored in those cells.

In the architecture of FIG. 3, column decoder 26 receives at least a portion of a column address value, decodes that column address value, and generates column select signals that are applied to column select circuit 22. Column select circuit 22 responds to these column select signals by coupling the corresponding bit lines BL[n−1:0] associated with one or more columns selected by the column address value to the corresponding read circuits 24. Read circuits 24 are constructed in the conventional manner, as will be described below, and will communicate the data states from the selected EPROM cells to data bus DATA_OUT. Alternatively, the position of column select circuit 22 and read circuits 24 in the data path may be reversed, such that read circuits 24 directly receive and sense bit lines from the columns of memory array 20, and column select circuit 22 then selecting one or more of the data output lines from read circuits 24 according to the column address.

Figure 1A:
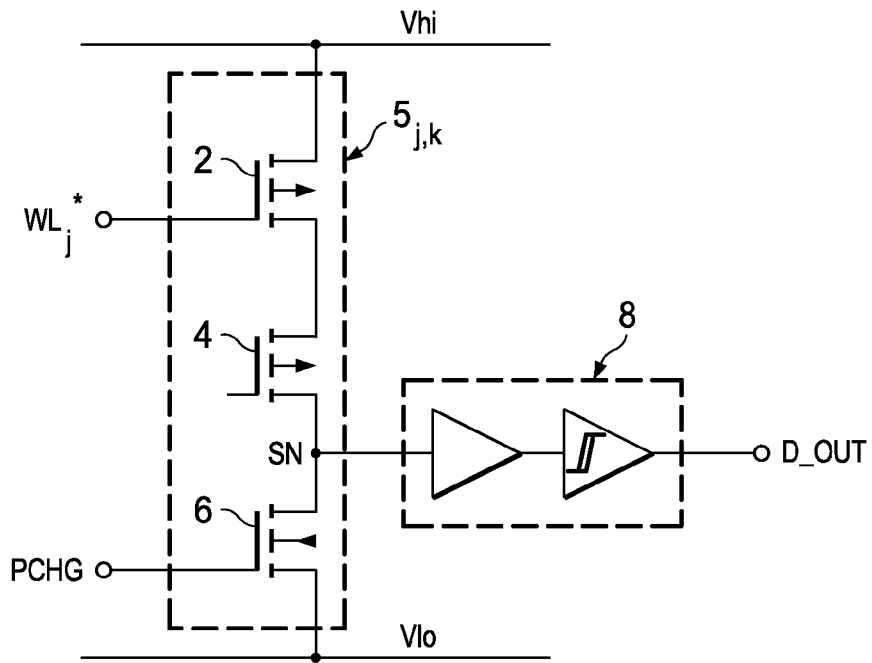
FIG. 1a is an electrical diagram, in schematic form, of a conventional non-volatile memory cell and read circuit.
Figure 1B:
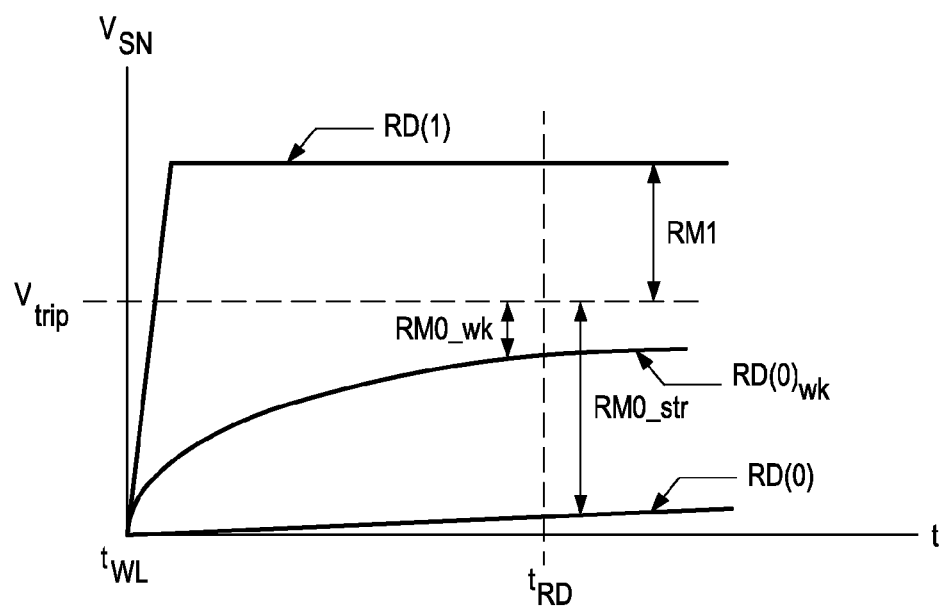
FIG. 1b is a timing diagram illustrating the behavior of the conventional memory cell of FIG. 1a in a read cycle.

Precharge circuitry 27 is provided to apply a precharge voltage to cells in memory array 20 in advance of each read operation, for example at the beginning of a read cycle as discussed above relative to FIG. 1 and as will be described below.

According to embodiments of this invention, EPROM 19 also includes read margin measurement circuitry 30. As shown in FIG. 3 and as will be described in further detail below, read margin measurement circuitry 30 is coupled to read circuits 24, and will determine read margin values for one or more selected EPROM cells in memory array 20. In the example shown in FIG. 3, read margin measurement circuitry 30 presents a multi-bit digital word indicating the measured read margin value on lines RM_OUT. It is contemplated that read margin measurement circuitry 30 will be enabled in a special test mode of operation of integrated circuit 10, and disabled during normal functional operation so as not to unduly load the data path of EPROM 19 or consume power. The special test mode is contemplated to be invoked by control circuitry in integrated circuit 10 in the conventional manner known in the art for large scale integrated circuits.

Figure 4:
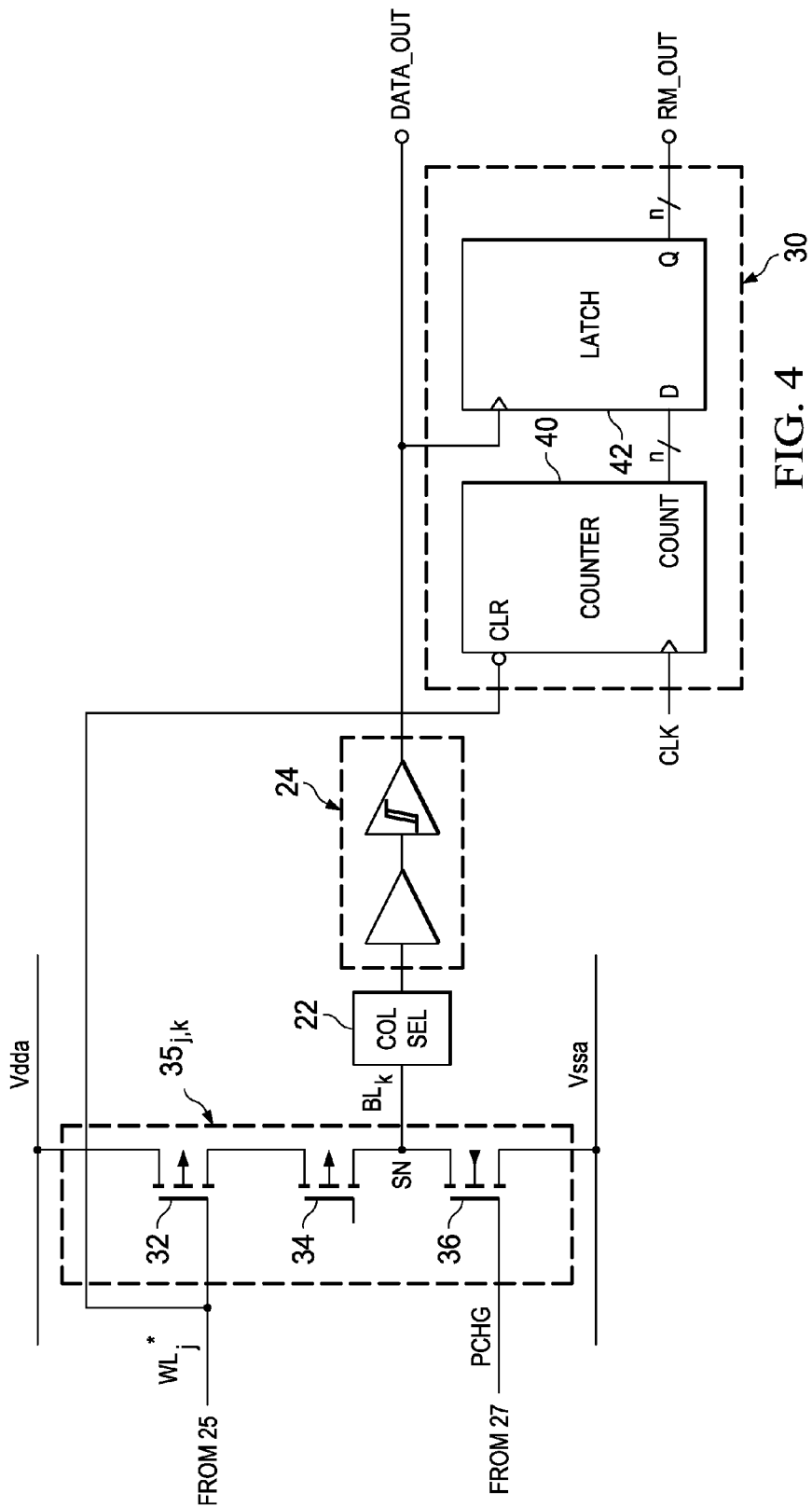
FIG. 4 is an electrical diagram, in schematic form, of circuitry for measuring the read margin of a memory cell in the memory of FIG. 3, according to embodiments of the invention.

FIG. 4 illustrates the arrangement of read margin measurement circuitry 30 in combination with one memory cell 35$_{j,k}$ in memory array 20, according to an embodiment of the invention. It is contemplated that this instance of read margin measurement circuitry 30 may be shared among multiple memory cells 35, for example on a column-by-column basis by the operation of column select circuitry 22. A particular example of such a sharing arrangement according to another embodiment of the invention will be described in further detail below.

In the arrangement of FIG. 4, memory cell 35$_{j,k}$ is constructed in the conventional manner for a UV EPROM or OTP memory cell, and as such includes p-channel MOS select transistor 32, p-channel MOS floating-gate transistor 34, and re-channel MOS precharge transistor 36. The source/drain paths of transistors 32, 34, 36 are connected in series with one another between array power supply voltage Vdda and array reference voltage Vssa, with sense node SN at the common drain node of transistors 34, 36, driving bit line BL$_k$. The gate of select transistor 32 receives word line WL$_j$* for row j in which cell 35$_{j,k}$ resides, as driven by row decoder 25 in response to the row address. The gate of precharge transistor 36 receives precharge signal PCHG from precharge circuitry 27. The gate electrode of floating-gate transistor 34 is, of course, left floating.

Sense node SN and bit line BL$_k$ are connected to the input of read circuit 24 via column select circuit 22 in this example; alternatively, as mentioned above, column select circuit 22 may follow read circuit 24 in the data path. Read circuit 24 in this embodiment of the invention is constructed in the conventional manner, for example as a buffer and Schmitt trigger in series, as shown in FIG. 4. Other alternative constructions of read circuit 24 known in the art may alternatively be used, such alternative approaches including differential amplifiers and the like. In this case, read circuit 24 is constructed to operate around a trip voltage V$_{trip}$, such that a voltage at sense node SN exceeding this trip voltage V$_{trip}$ will cause a transition or pulse at the output of read circuit 24, at data out line DATA_OUT.

In operation, as described above, floating-gate transistor 34 is either programmed to conduct under drain-to-source bias by applying a bias that causes a sufficient number of electrons to tunnel to and become trapped at the floating gate electrode, or left in its as-manufactured state in which excess electrons are not trapped at the floating gate electrode and thus in which transistor 34 does not conduct under drain-to-source bias. As a matter of semantics, this unprogrammed non-conductive state of cell 35$_{j,k}$ may also be considered as cell 35$_{j,k}$ having been programmed to a non-conductive state (the "0" data state in this example). Indeed, it is contemplated that some floating-gate transistors may be constructed so that their "unprogrammed" state is the conductive state, such that programming of the transistor is required to render it non-conductive under drain-to-source bias. As such, this description will refer to both the conductive and non-conductive states ("0" and "1" states) as programmed states, even if one of those states corresponds to the floating-gate transistor or cell that is in fact in its unprogrammed, or as-manufactured, state.

The state of cell 35$_{j,k}$ is read by precharge transistor 36 being turned on by an active high level of precharge signal PCHG, which precharges sense node SN by discharging it to array reference voltage Vssa. Upon word line WL$_j$* being driven active low by row decoder 25, sense node SN is either pulled toward array power supply voltage Vdda if floating-gate transistor 34 has been programmed to its conductive state, or remains at a low voltage near array reference voltage Vssa if floating-gate transistor 34 remains in its unprogrammed, non-conductive, state. Upon the voltage of sense node SN crossing the trip voltage V$_{trip}$ of read circuit 24, for the case of a programmed "1" state at floating-gate transistor 34, the output of read circuit 24 will make a low-to-high transition. In this example, in which cell 35$_{j,k}$ is of a precharge-discharge type, EPROM 19 will typically be accessed in a synchronous manner, with one read cycle following another. Accordingly, at some time following the expected read time within the read cycle, word line WL$_j$* will be driven inactive high, turning off select transistor 32, and precharge transistor 36 will again be turned on at the beginning of the next cycle. The transition at the output of read circuit 34 will thus typically appear as a pulse, depending on the cycle time.

Alternatively, cell 35$_{j,k}$ may be constructed with transistors 32, 34, 36 of opposite channel conductivity type. In this alternative example, an n-channel precharge transistor will have its drain at array power supply voltage Vdda, and its source connected to the source of an n-channel floating-gate transistor at sense node SN; an re-channel select transistor will then have its drain connected to the source of the floating-gate transistor, and its source at array reference voltage Vssa. The polarities of the precharge signal and word line will, of course, also be the opposite of that in the case of cell 35$_{j,k}$. In operation, sense node SN will be precharged to a voltage at or near array power supply voltage Vdda, and will either remain at that precharged voltage or be pulled low toward to Vssa upon the select transistor being turned on by the word line for the row being driven by row decoder 25, depending on the programmed state of floating-gate transistor 34.

Further in the alternative, while the arrangement of FIG. 4 illustrates cell 35$_{j,k}$ in a form corresponding to a UV EPROM or OTP memory, it is contemplated that embodiments of this invention may also be applicable to electrically erasable memory cells. In that erasable case, cell 35$_{j,k}$ will also include the appropriate electrode or circuitry for reversing the trapped charge at its floating gate, in the conventional manner.

As mentioned above in connection with the Background of the Invention, it is useful to determine the read margin of electrically programmable memory cells. However, as also discussed in the Background of the Invention, the direct measurement of read margin requires the implementation of analog circuitry into the memory architecture, and also the generation of stable regulated analog voltages; such circuitry can be costly from a manufacturing process and chip area standpoint.

Figure 5:
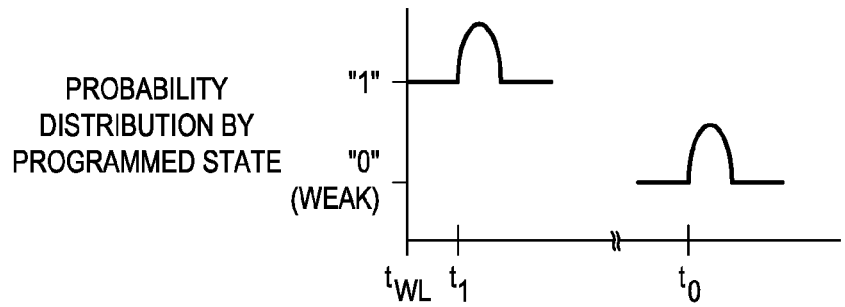
FIG. 5 is a probability distribution plot illustrating the behavior of a population of memory cells in the memory of FIG. 3 in a read cycle, for both data states.

It has been discovered, in connection with this invention, that the read margin of an electrically programmable memory cell, for example of the precharge/discharge type as described above in connection with cell $35_{j,k}$, can be determined by measuring the elapsed time from the beginning of read cycle to the time at which the output of read circuit 24 makes a transition. FIG. 5 illustrates the behavior of a population of cells 35 in read operations. For the case in which the floating-gate transistors 34 of this population of cells 35 are programmed to the conductive "1" state, the distribution of times at which the corresponding read circuits 24 produce an output pulse will be centered at a relatively short time $t_1$ following the energizing of word line $WL_j$ at time $t_{WL}$. For example, in modern OTP memories, the time elapsed from read time $t_{WL}$ to time $t_1$ may be on the order of ten nanoseconds or less. In contrast, for the case in which floating-gate transistors 34 of this population of cells 35 are in the non-conductive "0", state, leakage will cause sense node SN of cell $35_{j,k}$ to eventually drift toward array power supply voltage Vdda from its precharged level at or near reference voltage Vssa and cross the trip voltage $V_{trip}$ of read circuit 24. The distribution of these leaky cells 35 is shown in FIG. 5 to be centered at time $t_0$, which can be much later than the shorter "1" state time $t_1$, for example on the order of tens of microseconds.

As shown in FIG. 4, read margin measurement circuitry 30 is constructed to measure the time elapsed between read time $t_{WL}$ and the time at which a leaky unprogrammed floating-gate transistor 34 pulls sense node SN past the trip voltage of read circuit 24. In this embodiment of the invention, read margin measurement circuitry 30 includes counter 40 and latch 42. Counter 40 is a digital counter having a clock input receiving clock signal CLK, which may correspond to the read cycle clock for EPROM 19, or which alternatively may be some other clock signal in integrated circuit 10. In this example, counter 40 optionally has its "clear" input CLR receiving word line signal $WL_j$* (inverted). Counter 40 advances its contents with each cycle of clock signal CLK, and presents those contents as a multiple-bit digital word at its output COUNT. Output COUNT from counter 40 is coupled to a multiple-bit data input D of latch 42. Latch 42 has its clock input coupled to the output of read circuit 24, and presents its stored contents at output signal RM_OUT.

It is contemplated that the read margin measurement will typically be performed in a special test mode of integrated circuit 10, invoked in the conventional manner, and extending the read cycle for cell $35_{j,k}$. In operation in this special test mode, the contents of counter 40 are cleared upon the energizing of word line $WL_j$* to an active low level. Each subsequent cycle of clock signal CLK will then advance the contents of counter 40, such that the contents of counter 40 will represent the number of cycles of clock signal CLK since the initiation of this read operation. For the case of floating-gate transistor 34 in its non-conductive "0" state, counter 40 will continue to advance its contents until such time as sense node SN has been pulled by select transistor 32 and the (leaky) floating-gate transistor 34 to a voltage that causes read circuit 24 to drive a low-to-high transition at its output. This transition is received at the clock input of latch 42, and causes the then-current contents of counter 40 to be stored in latch 42, and to be presented at output RM_OUT.

This embodiment of the invention is thus able to provide an accurate measurement of the read margin for the state in which floating-gate transistor 34 of cell $35_{j,k}$ is in its non-conductive state. This measurement can be useful in many applications. For example, characterization of the read margin can provide important information for purposes of yield analysis, device reliability measurement, and evaluation of later-life failures. In particular, the read margin can be precisely quantified according to this embodiment of the invention rather than deduced from a go/no-go (i.e., pass/fail) test. As a result, inaccuracies inherent in the use of proxies such as power supply voltage, temperature, etc. are avoided.

As mentioned above, it may take a significant time for sense node SN to rise above trip voltage Vtrip of read circuit 24, particularly if floating-gate transistor 34 in cell $35_{j,k}$ under test exhibits very low leakage. As such, the read margin measurement for the "0" state (i.e., non-conductive floating gate transistor 34) state, individually for each memory cell 35 of EPROM 19, may require significant test time. According to another embodiment of the invention, read margin measurement circuit 30 is constructed so that multiple cells 35 can be tested for read margin in parallel.

According to this embodiment of the invention, read margin select circuit 50 is inserted between the output of read circuits 24 associated with multiple cells 35 to be tested, and read margin measurement circuit 30. In the example shown in FIG. 6, read margin select circuit 50 receives inputs from four read circuits $24_0$ through $24_3$, which receive the sense node voltage from four corresponding cells $35_0$ through $35_3$ (as may be selected by row decoder 25, and by column select circuit 22 if present). As will be evident to those skilled in the art having reference to this specification, more or fewer cells 35 may be applied in parallel to read margin select circuit 50. In this embodiment of the invention, read select circuit includes an instance of exclusive-OR gate $44_0$ through $44_3$ for each read circuit $24_0$ through $24_3$, respectively. Each gate $44_0$ through $44_3$ has an input receiving the output of its respective read circuit $24_0$ through $24_3$ (with its logic level inverted in this example). The other input of each exclusive-OR gate $44_0$ through $44_3$ receives control signal readmg0, which is generated by test control circuitry (not shown) elsewhere in integrated circuit 10. In normal operation, when read margin measurements are not to be taken, control signal readmg0 is held at an inactive low level; during read margin "0" measurements, control signal readmg0 will be driven by this test control circuitry to an active high level.

The output of each exclusive-OR gate $44_0$ through $44_3$ is connected to the input of a corresponding NAND gate $46_0$ through $46_3$, respectively. Individual select control signals $\overline{\text{deselect0}}$ through $\overline{\text{deselect3}}$ are applied to another input of NAND gate $46_0$ through $46_3$, respectively. Select control signals $\overline{\text{deselect0}}$ through $\overline{\text{deselect3}}$ allow the test control circuitry to selectively include or exclude read circuits $24_0$ through $24_3$ (and thus their corresponding cells $35_0$ through $35_3$) from read margin measurement. In this example, an active logic high level on a given select control signal $\overline{\text{deselect0}}$ through $\overline{\text{deselect3}}$ allows the output of its corresponding exclusive-OR gate $44_0$ through $44_3$, respectively, to control the output of its corresponding NAND gate $46_0$ through $46_3$; conversely, an inactive logic low level on a given select control signal $\overline{\text{deselect0}}$ through $\overline{\text{deselect3}}$ blocks the output of its corresponding exclusive-OR gate $44_0$ through $44_3$, from affecting the output of its corresponding NAND gate $46_0$ through $46_3$. This masking ability allows the read margin measurement of a selected subset of cells $35_0$ through $35_3$, down to a single cell 35 if desired. In addition, the masking enabled by NAND gates $46_0$ through $46_3$ allows the read margin "0" measurement to comprehend the programmed data states in EPROM 19, blocking the output of those cells 35 storing a conductive "1" (conductive) data state from read margin measurement circuit 30.

The outputs of NAND gates $46_0$ through $46_3$, in this embodiment of the invention, are each connected to an input of NAND gate 48. As will be evident from the following description, NAND gate 48 communicates the "0" to a "1" output level transition of the first one of the group of read circuits $24_0$ through $24_3$ to read margin measurement circuitry 30.

Figure 6:
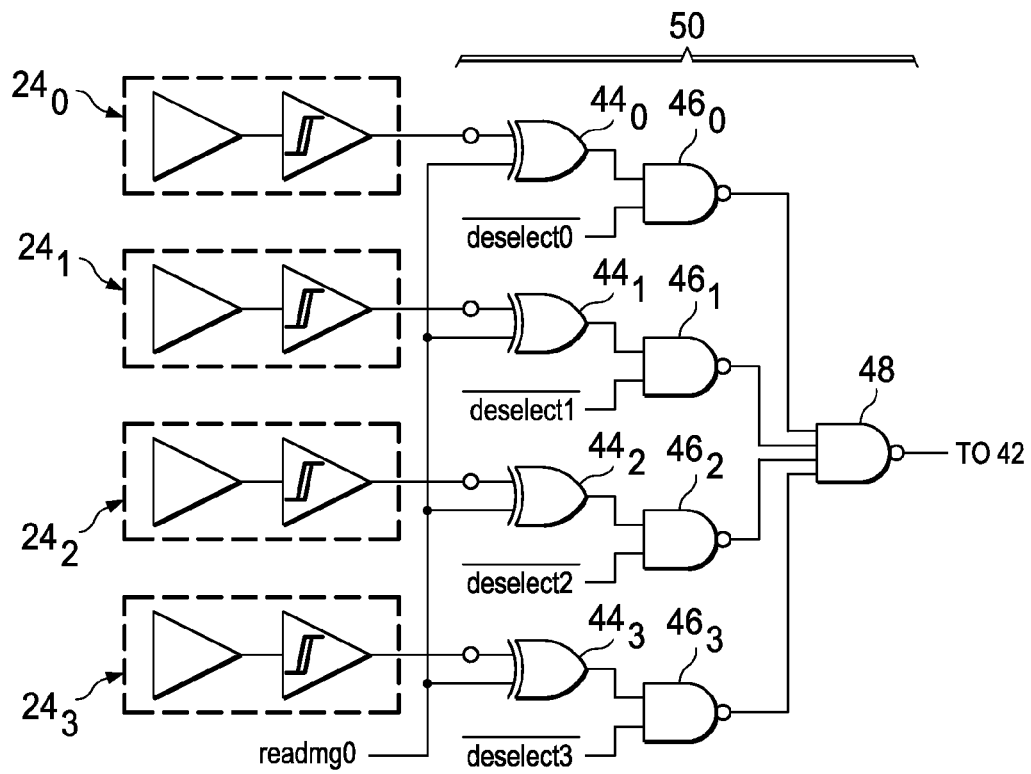
FIG. 6 is an electrical diagram, in schematic form, of circuitry for measuring the read margin of multiple memory cells in the memory of FIG. 3, according to embodiments of the invention.

Of course, the particular logic used to realize read margin select circuit 50 may vary from that shown in FIG. 6. The ability to selectively enable and disable the read margin measurement by way of logic gates is useful, particularly if circuitry is provided for measuring the read margin of the opposite programmed state, as will be described below. And the ability to mask or select those cells of the group that are to be measured, and those that are not, enables measurement of multiple cells 35 in parallel, while retaining the ability to analyze individual cells if desired.

In operation, according to this embodiment of the invention, cells $35_0$ through $35_3$ that are to be measured are accessed in a read cycle. As described above, the read cycle begins with the precharging of sense node SN in each of these cells 35 by the assertion of precharge signal PCHG (FIG. 4) while word lines $WL_j$ are inactive, pulling sense node SN in each cell 35 to array reference voltage Vssa. Following the precharge operation, word lines $WL_j$ associated with the row or rows in which cells 35 to be measured are driven active, such that sense nodes SN of these cells 35 will remain at a logic low level, subject to leakage through the unprogrammed ("0", or nonconductive, state) floating-gate transistors 34 of those cells 35 as described above. Sense nodes SN of cells 35 under test are communicated to corresponding read circuits $24_0$ through $24_3$ of FIG. 6 via corresponding bit lines. It is contemplated that one or more of these word lines $WL_j$ (or a logical OR of those word lines, or a read cycle clock) will clear the contents of counter 42 of read margin measurement circuit 30 at the beginning of this read cycle.

Measurement of the read margin "0" of the selected cells $35_0$ through $35_3$ is enabled by control signal readmg0 at an active high level, allowing the output of exclusive-OR gates $44_0$ through $44_3$ to follow the output of read circuits $24_0$ through $24_3$, respectively. At the beginning of the read margin "0" measurement operation, assuming that cells $35_0$ through $35_3$ under test are all functional, the output of each of read circuits $24_0$ through $24_3$ will be at a logic low level, which will be reflected as a logic low level at the output of exclusive-OR gates $44_0$ through $44_3$.

For each one of read circuits $24_0$ through $24_3$ that is to be involved in the read margin measurement operation, its corresponding deselect control signal $\overline{deselect0}$ through $\overline{deselect3}$ will be at a logic high level, which allows the output of each NAND gate $46_0$ through $46_3$ to be controlled by the level at the output of its respective exclusive-OR gates $44_0$ through $44_3$. Those NAND gates $44_0$ through $44_3$ that receive a deselect signal $\overline{deselect0}$ through $\overline{deselect3}$ at a logic low level (indicating that its corresponding read circuit $24_0$ through $24_3$ is not to be involved in the read margin measurement) will present a logic high level at its output regardless of the output of its read circuit $24_0$ through $24_3$. At the beginning of the read margin measurement, the outputs of exclusive-OR gates $44_0$ through $44_3$ are all at a logic low level, and as such the output of each of NAND gate $44_0$ through $44_3$ will initially be at a logic high level. Accordingly, the output of NAND gate 48 that is connected to the clock input of latch 42 will initially be at a logic low level as the read cycle begins. Counter 40 will receive pulses of clock signal CLK in the meanwhile, responsive to each of which its contents will advance, as described above.

Read margin select circuit 50 communicates a transition to the clock input of latch 42 responsive to the first of cells $35_0$ through $35_3$ under test for which its sense node SN rises to a voltage sufficient to trip its read circuit $24_0$ through $24_3$. Typically, this event will typically occur after a number of cycles of clock signal CLK, depending on the extent of leakage through floating-gate transistor 34 of that cell 35. For example, if cell $35_2$ is the weakest one of the cells under test, the low-to-high transition at the output of its read circuit $24_2$ will cause a low-to-high transition at the output of exclusive-OR gate $44_2$. Assuming that deselect signal $\overline{deselect2}$ enables response of NAND gate $46_2$ to this event (i.e., is at a logic high level), NAND gate $46_2$ drives a high-to-low transition at its output. This transition causes the output of NAND gate 48 to make a low-to-high transition, which causes latch 42 to store the then-current output of counter 40. The read margin measurement, in clock cycles, of the weakest of cells $35_0$ through $35_3$ under test (i.e., cell $35_2$ in this example), is then presented by latch 42 onto bus RM_OUT.

In this arrangement, as will be described in detail below relative to FIG. 6, the read margin measured among the multiple cells 35 will be the worst-performing (i.e., leakiest) of the cells 35 under test. If desired, further repetition of the read margin measurement can then be performed, using different combinations of deselect signal $\overline{deselect0}$ through $\overline{deselect3}$, to identify that weakest cell 35. The test time required for these repetitions can be controlled, however, because the read margin for the weakest cell 35 is now known—if no transition is found for a given set of cells 35 by that measured time, the tester can assume that the previously-found weakest cell 35 is not in that set.

Other uses of the parallel read margin measurement provided by this embodiment of the invention are also contemplated. For example, the parallel test arrangement can facilitate the characterization of the distribution of cell read margins over a large population, measurement of the effects of aging on read margin performance, and other uses that will be apparent to those skilled in the art having reference to this specification.

The embodiments of the invention described above are directed to measurement of the read margin for floating-gate memory cells that are storing a data state corresponding to the floating-gate transistor being non-conductive in the read operation. For the example of cell $35_{j,k}$ of FIG. 4, as described above, this non-conductive state corresponds to a "0" data state. According to other embodiments of the invention, the read margin for cells in which the floating-gate transistor is programmed to a conductive state (e.g., a "1" state for cell $35_{j,k}$) can be measured, as will now be described in connection with FIGS. 7, 8a, and 8b.

Figure 7:
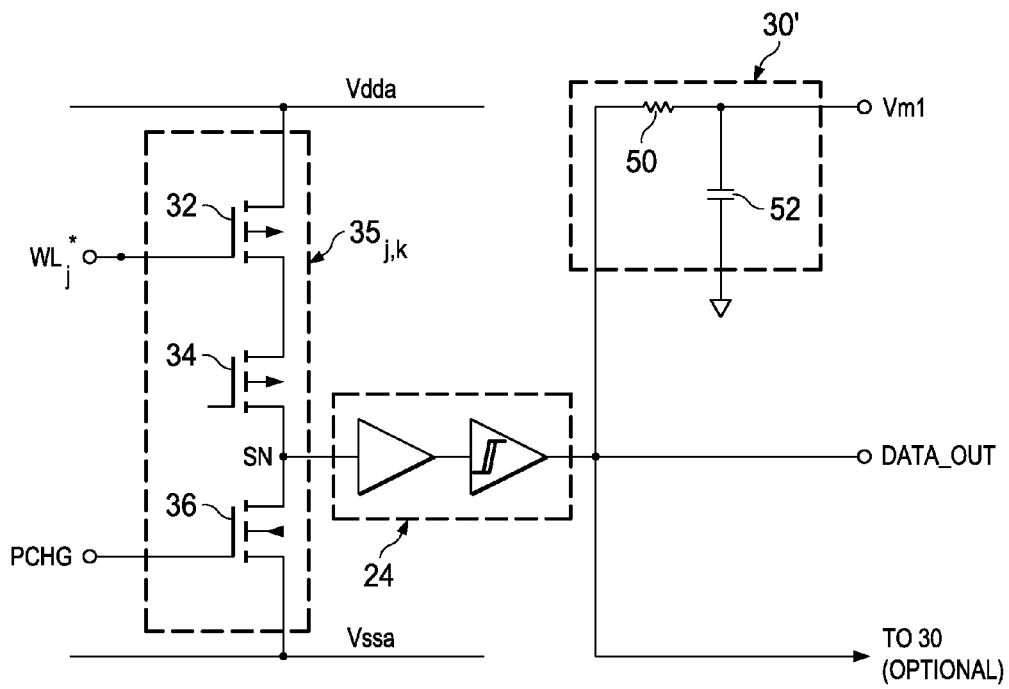
FIG. 7 is an electrical diagram, in schematic form, of circuitry for measuring the read margin of a memory cell in the memory of FIG. 3, for an opposite data state from that measured in FIGS. 5 and 6, according to embodiments of the invention.

FIG. 7 illustrates the construction of read margin measurement circuit 30' for measuring read margin for this opposite data state. As shown in FIG. 7, read margin measurement circuit 30' is shown in combination with cell $35_{j,k}$ and read circuit 24 constructed in the manner described above. It is of course contemplated that read margin measurement circuit 30' may be useful in combination with other similar cell and read circuit constructions, with any appropriate modifications as will be apparent to those skilled in the art having reference to this specification. In addition, read margin measurement circuit 30' for measuring "read margin 1" for the example of cell $35_{j,k}$ may be implemented in parallel with read margin measurement circuit 30 for measuring "read margin 0" as described above relative to FIG. 4.

In the embodiment of the invention shown in FIG. 7, read margin measurement circuit 30' is implemented as a circuit that develops a voltage at terminal Vm1 in response to pulses at the output of read circuit 24. In this embodiment of the invention, read margin measurement circuit 30' is constructed as a simple low-pass filter in the form of an R-C network of resistor 50 and capacitor 52. More specifically, resistor 50 is connected between the output of read circuit 24 and terminal Vm1, with capacitor 52 connected across terminal Vm1 and a ground voltage. The component values of resistor 50 and capacitor 52 are selected to have a time constant substantially larger than the average read cycle period.

In this example, with floating-gate transistor 34 is programmed to its conductive "1" state. As such, once select transistor 32 is turned on by word line $WL_j^*$, sense node SN of cell $35_{j,k}$ will be rapidly pulled toward array power supply voltage Vdda. As described above, this event is contemplated to occur well within a clock cycle, for example on the order of several nanoseconds. In this case, however, the read margin depends on the strength with which floating-gate transistor 34 conducts, which depends on such factors as the magnitude of the trapped charge at its floating gate electrode, either as programmed or as remains trapped over operating life. Accordingly, this strength of floating-gate transistor 34 is reflected in the time within that clock cycle at which sense node SN crosses the trip voltage of read circuit 24, resulting in a transition at the output of read circuit 24. According to this embodiment of the invention, cell $35_{j,k}$ is read a number of times in succession, for example on the order of one hundred consecutive cycles, over which the output of read circuit 24 presents a pulse-width modulated signal at a duty cycle corresponding to the speed at which read circuit 24 presents the logic high level at its output within each read cycle, which is reflective of the read margin for the "1" (conductive) data state. The average fraction of time that the output of read circuit 24 is at a logic high level (i.e., its duty cycle, in the pulse-width-modulated sense) over this sequence of cycles develops a corresponding voltage at terminal Vm1, by the action of read margin measurement circuitry 30', that indicates that read margin.

In operation, the read margin "1" test for a cell $35_{j,k}$ begins with the voltage at terminal Vm1 at ground. During each of the read cycles accessing cell $35_{j,k}$ the output of read circuit 24 makes a low-to-high transition in response to select transistor 32 being turned on by word line $WL_j^*$, with the time of that transition within the read cycle dependent on the read margin of cell $35_{j,k}$. In response to each transition, capacitor 52 is charged at a time constant determined by resistor 50 and capacitor 52, which as mentioned above is much longer (e.g., at least 100 times longer) than the read cycle period. At the end of each read cycle, select transistor 32 is turned off and precharge transistor 36 is turned on, and the output of read circuit 24 responds by driving a high-to-low transition.

For the example of the simple R-C low pass filter implementation of read margin measurement circuit 30', the voltage at terminal Vm1 asymptotically approaches a level:

$$Vm1 \propto D(V_{hi} - V_{lo}) + V_{lo}$$

where D is the duty cycle at the output of read circuit 24 for cell $35_{j,k}$ under test, $V_{hi}$ is the voltage at the output of read circuit 24 at a logic high level, and $V_{lo}$ is the voltage at the output of read circuit 24 at a logic low level. An instance of cell $35_{j,k}$ with a stronger read margin in the "1" state will thus generate a higher voltage Vm1 than will a cell $35_{j,k}$ with a poorer read margin in the "1" state.

According to this embodiment of the invention, therefore, the read margin for memory cells in which the floating-gate transistor is programmed to a conductive state can be readily interrogated and precisely measured.

In this regard, it is contemplated that other arrangements of read margin measurement circuit 30' may alternatively or additionally be used, including other types of accumulating circuits such as operational amplifiers, sample-and-hold circuits, integrating circuits, and the like. In addition, as mentioned above, it is contemplated that read margin measurement circuits 30, 30' of both types may be implemented in connection with the same EPROM 19, with gating logic (e.g., similar to exclusive-OR gates $44_0$ through $44_3$ of FIG. 6) provided to enable selection of the data state for which the read margin measurement is to be performed. These and other variations are contemplated to be within the scope of the invention as claimed.

Embodiments of this invention provide important advantages in the construction and test of non-volatile memories. These advantages and benefits include the ability to precisely obtain a measurement of the read margins of floating-gate memory cells, in an efficient manner that can be implemented with minimal additional circuitry, and thus a low incremental chip area cost. These measurements may be obtained for either programmed data state, as described above. Particularly for the case of read margin measurement for memory cells in which the floating-gate transistor is in a non-conductive state, and thus in which the read margin measurement can require long test times, some embodiments of the invention provide a simple way of evaluating multiple memory cells in parallel, while still providing the ability to individually interrogate single memory cells.

While this invention has been described according to its embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. A programmable non-volatile memory, comprising:
   an array of memory cells arranged in rows and columns, each memory cell comprising:
   a floating-gate transistor having a source/drain path and a floating gate electrode;
   a precharge transistor, having a source/drain path connected to the source/drain path of the floating-gate transistor at a sense node, and having a gate receiving a precharge signal; and
   a select transistor, having a source/drain path connected in series with the source/drain paths of the floating-gate transistor and the precharge transistor between a first array power supply voltage and a second array power supply voltage, and having a gate receiving a word line;
   a read circuit, coupled to the sense node of a memory cell, and having an output; and
   a circuit, coupled to the output of the read circuit, for developing a voltage responsive to the output of the read circuit over a sequence of read cycles applied to a selected one of the memory cells.

2. The memory of claim 1, wherein the precharge transistor is of a first channel conductivity type;
and wherein the floating-gate transistor and the select transistor are of a second channel conductivity type.

3. The memory of claim 2, wherein the first channel conductivity type is re-channel and the second channel conductivity type is p-channel;
wherein the source/drain paths of the floating-gate transistor and the select transistor are connected in series between the sense node and the first array power supply voltage, and the source/drain path of the precharge transistor is connected between the second array power supply voltage and the sense node, the first array power supply voltage being higher than the second array power supply voltage.

4. The memory of claim 2, wherein the first channel conductivity type is p-channel and the second channel conductivity type is n-channel;
wherein the source/drain paths of the floating-gate transistor and the select transistor are connected in series between the sense node and the second array power supply voltage, and the source/drain path of the precharge transistor is connected between the first array power supply voltage and the sense node, the first array power supply voltage being higher than the second array power supply voltage.

5. The memory of claim 1, wherein the developing circuit comprises:
a resistor-capacitor network.

* * * * *